(12) United States Patent
Park

(10) Patent No.: US 6,756,957 B2
(45) Date of Patent: Jun. 29, 2004

(54) PRECHARGE METHOD AND PRECHARGE VOLTAGE GERNERATION CIRCUIT OF SIGNAL LINE

(75) Inventor: Sang-ho Park, Suwon (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/357,605

(22) Filed: Feb. 4, 2003

(65) Prior Publication Data

US 2003/0161189 A1 Aug. 28, 2003

(30) Foreign Application Priority Data

Feb. 22, 2002 (KR) .......................................... 2002-9572

(51) Int. Cl.$^7$ ................................................ G09G 3/36
(52) U.S. Cl. .......................... 345/92; 345/84; 345/87; 345/90; 345/80; 345/99; 345/100
(58) Field of Search .............................. 345/84, 87, 90, 345/92, 80, 55, 99, 100, 98

(56) References Cited

U.S. PATENT DOCUMENTS 6,191,769 B1 * 2/2001 Fujiwara et al. .............. 345/99
6,531,996 B1 * 3/2003 Murade ........................ 345/98
6,628,256 B2 * 9/2003 Nishimura .................... 345/96

FOREIGN PATENT DOCUMENTS

JP 7-295520 * 11/1995 ............ G09G/3/36

* cited by examiner

Primary Examiner—Andrew Q. Tran
(74) Attorney, Agent, or Firm—Mills & Onello, LLP (57) ABSTRACT

A signal line precharge method is provided. The signal line precharge method for precharging a signal line connected to an auxiliary source driver to a predetermined voltage level in a precharge mode involves, in response to the combination of a polarity inversion signal of input data and the most significant bit of the input data, outputting one voltage level selected among precharge voltages having different voltage levels, and in response to a precharge timing control signal, precharging the signal line to the selected voltage level. In the precharge method, in response to change of the polarity inversion signal and change of the MSB of data being input, a signal line connected to the auxiliary source driver is precharged to an optimal precharge level such that a short and constant slew rate of all output signal is maintained.

21 Claims, 10 Drawing Sheets

PRECHARGE METHOD AND PRECHARGE VOLTAGE GERNERATION CIRCUIT OF SIGNAL LINE

BACKGROUND OF THE INVENTION

1. Field of the Invention

The present invention relates to a liquid crystal device (LCD) source driver, and more particularly, to a precharge voltage generating method and precharge voltage generating circuit for making slew rates of output signals constant by precharging a signal line to the level of a next output signal regardless of the level of the next output signal.

2. Description of the Related Art

Figure 1:
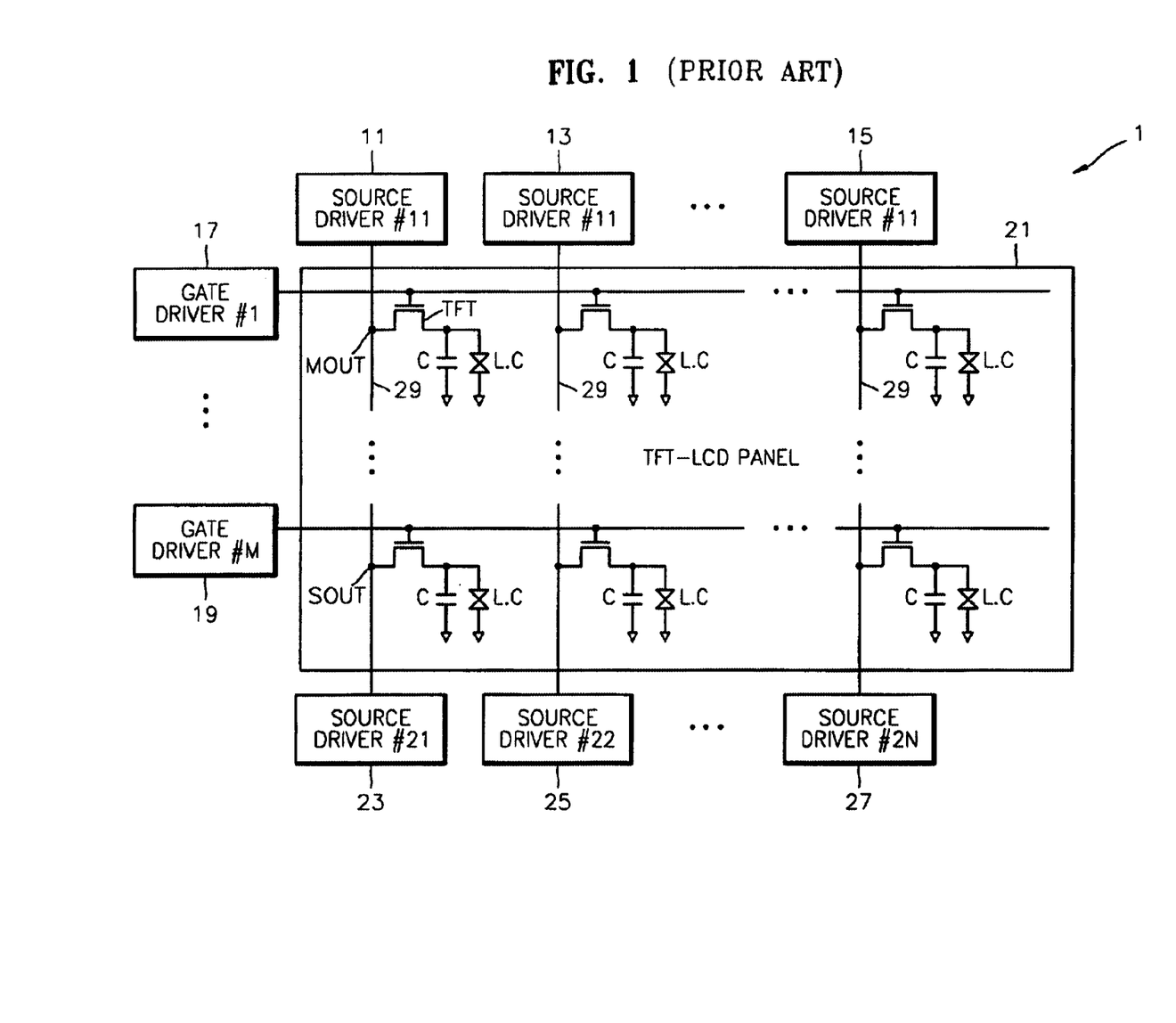
FIG. 1 is a diagram of a prior art LCD apparatus.

FIG. 1 is a diagram of a prior art LCD apparatus. Referring to FIG. 1, the prior art LCD apparatus 1 comprises a plurality of upper part source drivers 11 through 15, a plurality of lower part source drivers 23 through 27, a thin film transistor (TFT)-LCD panel 21 and a plurality of gate drivers 17 through 19.

As well known in the field of the present invention, a gate driver 17 drives the gate electrode of a TFT, and a source driver 11 provides a predetermined signal voltage to the source of the TFT through a signal line 29. For arranging source drivers, there are a single bank array and a dual bank array.

In the single bank array, a plurality of upper part source drivers 11 through 15 are arranged on the upper part of the TFT-LCD panel 21, or a plurality of lower part source drivers 23 through 27 are arranged on the lower part of the TFT-LCD panel 21 such that the signal line 29 is driven.

In the dual bank array, a plurality of upper part source drivers 11 through 15 are arranged on the upper part of the TFT-LCD panel 21 and a plurality of lower part source drivers 23 through 27 are arranged on the lower part of the TFT-LCD panel 21 such that the signal line 29 is driven.

When a high resolution, large-sized LCD panel is used, the dual bank array is used because of a short slew rate and a large load of the signal line 29.

However, the dual bank array needs double the printed circuit board (hereinafter, referred to as a "PCB") of the single bank array. Accordingly, in the dual bank array, the chip size and the number of elements increase.

SUMMARY OF THE INVENTION

To solve the above problems, it is an object of the present invention to provide a precharge voltage generating method and a precharge voltage generating circuit for making the slew rates of output signals constant by precharging a signal line connected to an auxiliary source driver to the level of a next output signal regardless of the level of the next output signal.

According to an aspect of the present invention, there is provided a signal line precharge method for precharging a signal line connected to an auxiliary source driver to a predetermined voltage level in a precharge mode, the method comprising: in response to the combination of a polarity inversion signal of input data and the most significant bit of the input data, outputting one voltage level selected among precharge voltages having different voltage levels; and in response to a precharge timing control signal, precharging the signal line to the selected voltage level.

In the signal line precharge method according to the present invention, it is preferable that the activation time of the precharge timing control signal be controlled and that the signal line be connected to the source of a thin film transistor (TFT).

Another signal line precharge method according to the present invention comprises: storing a first polarity inversion signal of first data; comparing the first polarity inversion signal with a second polarity inversion signal of second data being input following the first data; if the comparison result indicates that the phase of the first polarity inversion signal is different from the phase of the second polarity inversion signal, in response to the combination of the second polarity inversion signal and the most significant bit of the second data, outputting one voltage level selected among precharge voltages having different voltage levels; and in response to a precharge timing control signal, precharging a signal line connected to an auxiliary source driver to the selected voltage level.

Alternatively, the present invention provides a signal line precharge method comprising: storing a first polarity inversion signal of first data and the most significant bit of the first data; comparing the first polarity inversion signal with a second polarity inversion signal of second data being input following the first data, and comparing the most significant bit of the first data with the most significant bit of the second data; if the comparison result indicates that the polarity of the first polarity inversion signal is the same as the phase of the second polarity inversion signal and the most significant bit of the first data is different from the most significant bit of the second data, in response to the combination of the second polarity inversion signal and the most significant bit of the second data, outputting one voltage level selected among precharge voltages having different voltage levels; and in response to a precharge timing control signal, precharging a signal line connected to an auxiliary source driver to the selected voltage level.

In the alternative embodiments of the signal line precharge method according to the present invention, it is preferable that the activation time of the precharge timing control signal be controlled and that the signal line be connected to the source of a thin film transistor (TFT).

Another signal line precharge method according to the present invention for precharging each signal line connected to an auxiliary source driver IC corresponding to the signal line among a plurality of auxiliary source driver ICs, to a predetermined voltage level in a precharge mode, the method comprising: in response to the combination of a polarity inversion signal of input data and the most significant bit of the input data, outputting one voltage level selected among precharge voltages having different voltage levels; and in response to a precharge timing control signal, precharging the signal line to the selected voltage level.

Alternatively, the present invention provides a signal line precharge method for precharging each signal line, which is connected to an auxiliary source driver IC corresponding to the signal line among a plurality of auxiliary source driver ICs and sends a signal, to a predetermined voltage level in a precharge mode, the method comprising: storing a first polarity inversion signal of first data; comparing the first polarity inversion signal with a second polarity inversion signal of second data being input following the first data; if the comparison result indicates that the level of the first polarity inversion signal is different from the level of the second polarity inversion signal, in response to the combination of the second polarity inversion signal and the most significant bit of the second data, outputting one voltage level selected among precharge voltages having different voltage levels; and in response to a precharge timing control signal, precharging a signal line connected to an auxiliary source driver to the selected voltage level.

According to another aspect of the present invention, there is provided a precharge voltage generating circuit for precharging a signal line connected to an auxiliary source driver to a predetermined voltage level in a precharge mode, the precharge voltage generating circuit comprising: a precharge voltage selection circuit which in response to the combination of a polarity inversion signal of input data and the most significant bit of the input data, outputs one voltage level selected among precharge voltages having different voltage levels; and an output circuit which in response to a precharge timing control signal, outputs the selected voltage level to the signal line.

It is preferable that the precharge timing control signal is activated in response to a clock signal and inactivated in response to an input signal which is input from the outside of the precharge voltage generating circuit, and the activation time of the precharge timing control signal is controlled in response to the input signal.

Another precharge voltage generating circuit according to the present invention for precharging a signal line connected to an auxiliary source driver to a predetermined voltage level in a precharge mode comprises: a pad; a precharge timing control circuit which in response to the combination of a clock signal and an input signal which is input through the pad, outputs a precharge timing control signal; a precharge voltage selection circuit which in response to the combination of a polarity inversion signal of input data and the most significant bit of the input data, outputs one voltage level selected among precharge voltages having different voltage levels; and an output circuit which in response to a precharge timing control signal, outputs the selected voltage level to the signal line. It is preferable that the activation time of the precharge timing control signal is controlled corresponding to the resistance of a variable external resistor which is connected between a power source voltage and the pad.

According to another aspect of the present invention, there is provided a module on which a plurality of auxiliary source driver ICs that are serially connected are mounted, wherein each of the auxiliary source driver ICs comprises a precharge voltage generating circuit which is connected to a signal line corresponding to the auxiliary source driver IC and precharges the signal line to a predetermined voltage level, and the precharge voltage generating circuit comprises: a precharge voltage selection circuit which in response to the combination of a polarity inversion signal of input data and the most significant bit of the input data, outputs one voltage level selected among precharge voltages having different voltage levels in a precharge mode; and an output circuit which in response to a precharge timing control signal, outputs the selected voltage level to the signal line.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DESCRIPTION OF THE PREFERRED EMBODIMENTS

Figure 2:
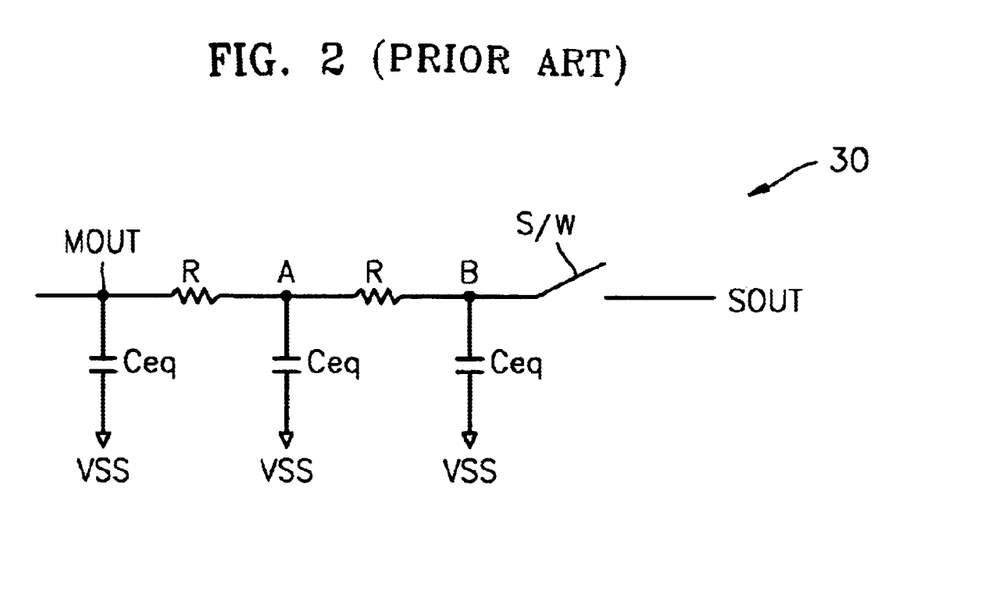
FIG. 2 is a diagram of an equivalent circuit of a source driver signal line of FIG. 1.

FIG. 2 is a diagram of an equivalent circuit of a source driver signal line of FIG. 1, and the equivalent circuit can be expressed by a plurality of resistances R and a plurality of equivalent capacitances Ceq.

Figure 3:
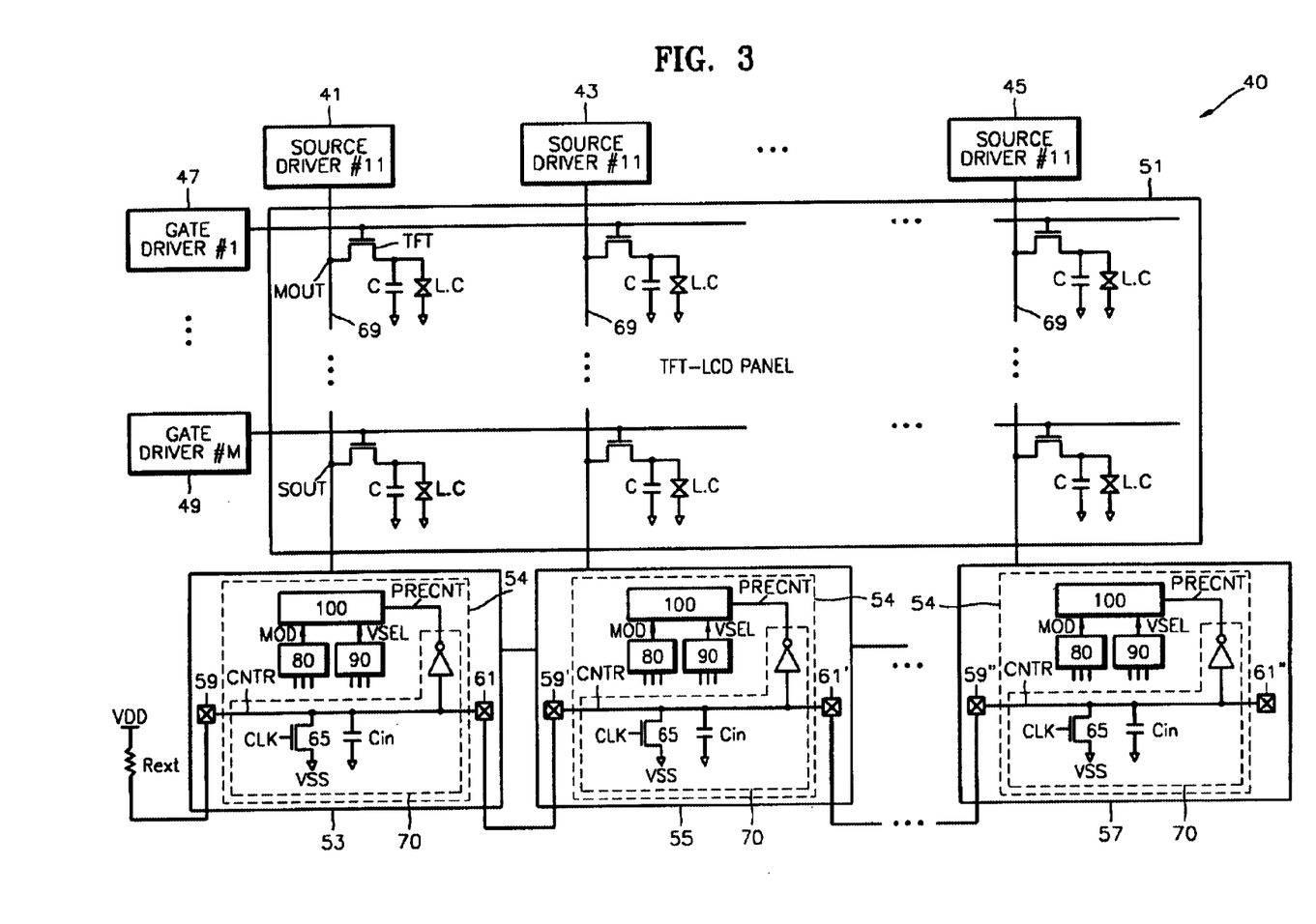
FIG. 3 is a schematic diagram of an LCD apparatus according to a preferred embodiment of the present invention.

FIG. 3 is a schematic diagram of an LCD apparatus according to a preferred embodiment of the present invention. The LCD apparatus of FIG. 3 comprises a plurality of source drivers 41 through 45, a TFT-LCD panel 51, a plurality of auxiliary source drivers 53 through 57, a plurality of gate drivers 47 through 49, and an external resistor Rext. The LCD apparatus of FIG. 3 is an example of a module.

A source driver 41 is connected to an auxiliary source driver 53 through a signal line 69 and each source of the plurality of TFTs is connected to the signal line 69.

The auxiliary source driver 53 is connected through a pad 59 to the external resistor Rext outside the LCD apparatus. The external resistor Rext is connected between a power source voltage VDD and the pad 59. The external resistor may be a variable resistor. Between the pad 59 and the ground VSS, a switching transistor 65 and a capacitor Cin are connected. In response to the activation of a clock signal CLK (for example, "high"), the switching transistor 65 pulls down an input signal CNTR to the ground VSS level.

Each of the plurality of auxiliary source drivers 53 through 57 has a precharge voltage generating circuit 54. The precharge voltage generating circuit 54 comprises a precharge timing control circuit 70, a mode selection signal 80, a precharge voltage selection circuit 90 and an output circuit 100.

The structure and operation of each circuit 70 through 100 will be described later referring to FIGS. 6 through 9. The external resistor Rext can control the activation cycle of a precharge timing control signal PRECNT.

If the plurality of auxiliary source drivers 53 through 57 are installed in one module as shown in FIG. 3, the pad 59 of the auxiliary source driver 53 is connected to the power source voltage VDD through the external resistor Rext, the pad 59 is electrically connected to a pad 61, the pad 61 is connected to a pad 59' of the auxiliary source driver 55 through a metal line on the PCB, and the pad 59' is electrically connected to a pad 61'.

The pad 61' is connected to a pad 59" of the auxiliary source driver 57 through the metal line on the PCB, and the pad 59" is connected to a pad 61". The pad 61" is floating. That is, the plurality of auxiliary source drivers 53 through 57 are connected to the external resistor Rext serially through the metal line on the PCB.

Figure 4:
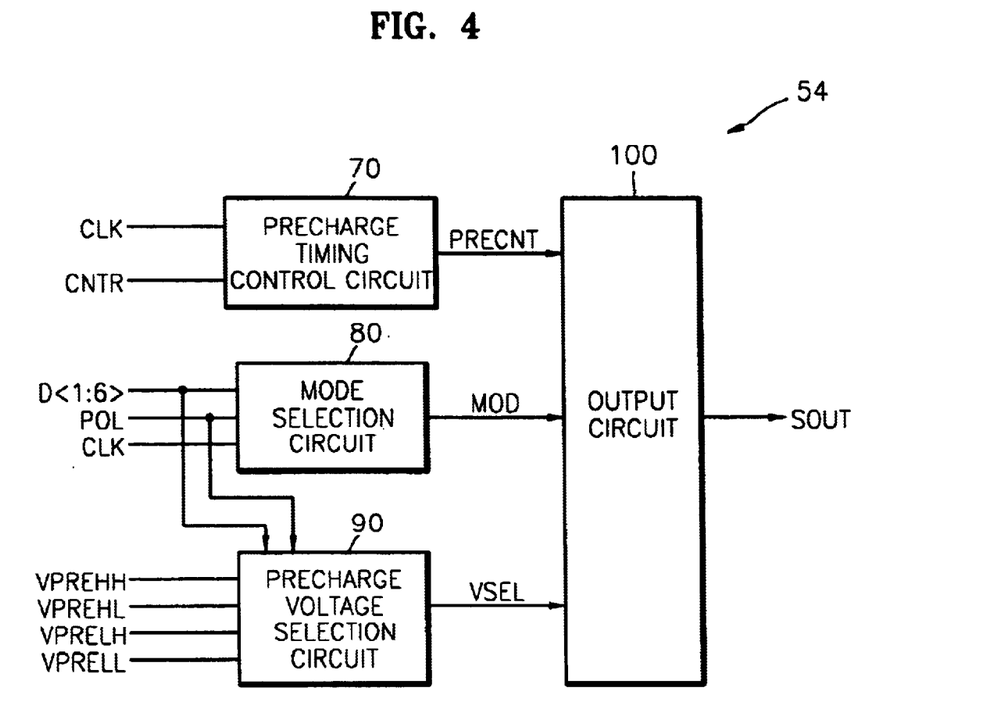
FIG. 4 is a block diagram of a precharge voltage generating circuit according a preferred embodiment of the present invention.

FIG. 4 is a block diagram of a precharge voltage generating circuit according a preferred embodiment of the present invention. Referring to FIGS. 3 and 4, the precharge voltage generating circuit 54 comprises a precharge timing control circuit 70, a mode selection circuit 80, a precharge voltage selection circuit 90, and an output circuit 100.

In response to the combination of a clock signal CLK and an input signal CNTR which is input to the pad 59 through the external resistor Rent, the precharge timing control circuit 70 outputs a precharge timing control signal PRECNT to the output circuit 100. The activation time of the precharge timing control signal PRECNT of the precharge voltage generating circuit 54 is determined by one resistor of the resistor Rext and one capacitance of the capacitor Cin.

In response to the clock signal CLK, the mode selection circuit 80 combines change in the phase of a polarity inversion signal POL and change in the most significant bit (hereinafter, referred to as an "MSB") (D<1:6>), and outputs a mode selection signal MOD. The mode selection signal MOD determines whether or not to precharge the signal line 69.

In response to the combination of the polarity inversion signal POL of data being currently input and the MSB (D<1:6>), the precharge voltage selection circuit 90 selects one voltage level VSEL among four precharge voltages VPREHH, VPREHL, VPRELH, and VPRELL having different voltage levels, and outputs the selected voltage level VSEL to the output circuit 100. In response to the precharge timing control signal PRECNT in a precharge mode, the output circuit 100 outputs the selected voltage VSEL to the signal line 69.

Here, the "precharge mode" indicates an operation mode where precharge can be performed with one voltage level VSEL selected among the four precharge voltages VPREHH, VPREHL, VPRELH, and VPRELL having different voltage levels.

Figure 5:
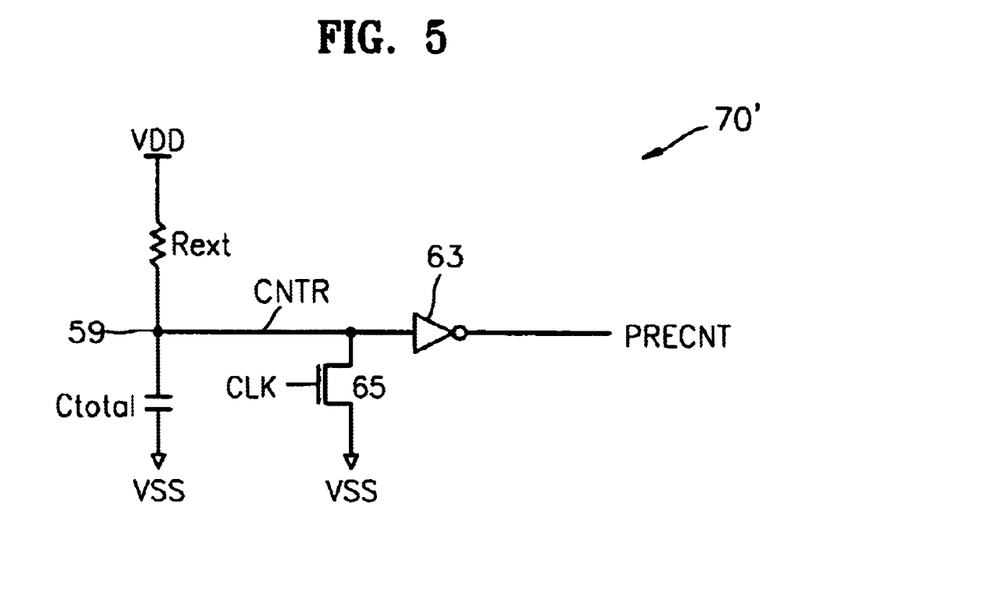
FIG. 5 is a diagram of an equivalent circuit of an auxiliary source driver of FIG. 3.

FIG. 5 is a diagram of an equivalent circuit of each of the auxiliary source drivers of FIG. 3. That is, the equivalent circuit 70' represents the external resistor Rext and the plurality of auxiliary source drivers 53 through 57 that are serially connected. Also in this case, the activation time of the precharge timing control signal PRECNT is determined by one external resistor Rext.

The external resistor Rext of the equivalent circuit 70' of FIG. 5 is connected between the power source voltage VDD and the pad 59, and an equivalent capacitor Ctotal is connected between the pad 59 and the ground VSS. The entire capacitance of the plurality of auxiliary source drivers 53 through 57 that are serially connected is equivalently expressed by the equivalent capacitor Ctotal.

The switching transistor 65 is formed with an NMOS transistor, and is connected between the pad 59 and the ground VSS. The clock signal CLK is input to the gate of the switching transistor 65. Also, the inverter 63 inverts the signal of the pad 59, and outputs a precharge timing control signal PRECNT.

Figure 6:
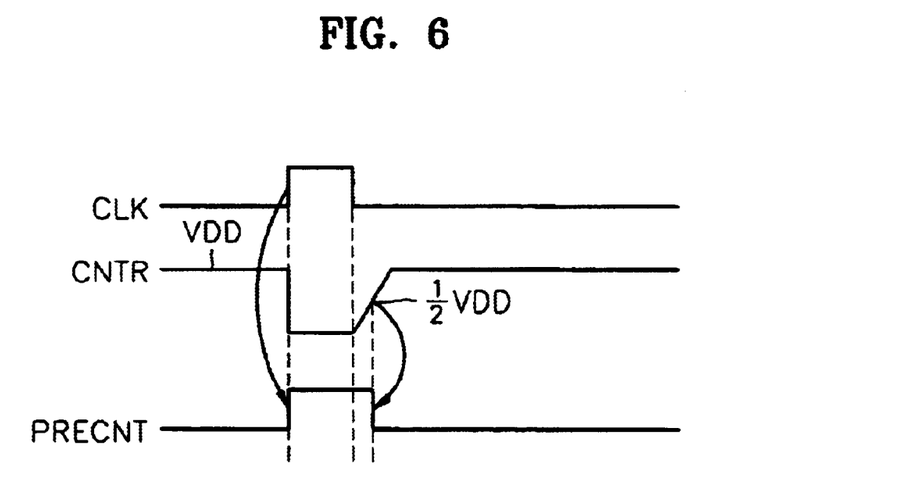
FIG. 6 is a timing diagram of an input/output signal of FIG. 5.

FIG. 6 is a timing diagram of an input/output signal of FIG. 5. Referring to FIGS. 5 and 6, the operation of the equivalent circuit 70' will now be described.

If the clock signal CLK is not activated (for example, a "low" logic level), the transistor 65 is turned off, the control signal CNTR maintains the power source voltage VDD level, and accordingly, the precharge timing control signal PRECNT is inactivated.

However, if the clock signal CLK is activated (for example, a "high" logic level), the transistor 65 is turned on, the input signal which is input through the pad 59 is pulled down to the ground VSS level, and accordingly, the precharge timing control signal PRECNT is activated. Then, if the clock signal CLK is inactivated (for example, transitioned to a "low" logic level), the transistor 65 is turned off, and the control signal CNTR gradually increases to the power source voltage VDD level as time passes.

When the trip point of the inverter 63 is VDD/2, if the input signal CNTR increases up to VDD/2, the output signal of the inverter 63, that is, the precharge timing control signal PRECNT, is inactivated. Therefore, the activation time (or interval) of the precharge timing control signal PRECNT can be controlled by the external resistor Rext connected to the pad 59.

Figure 7:
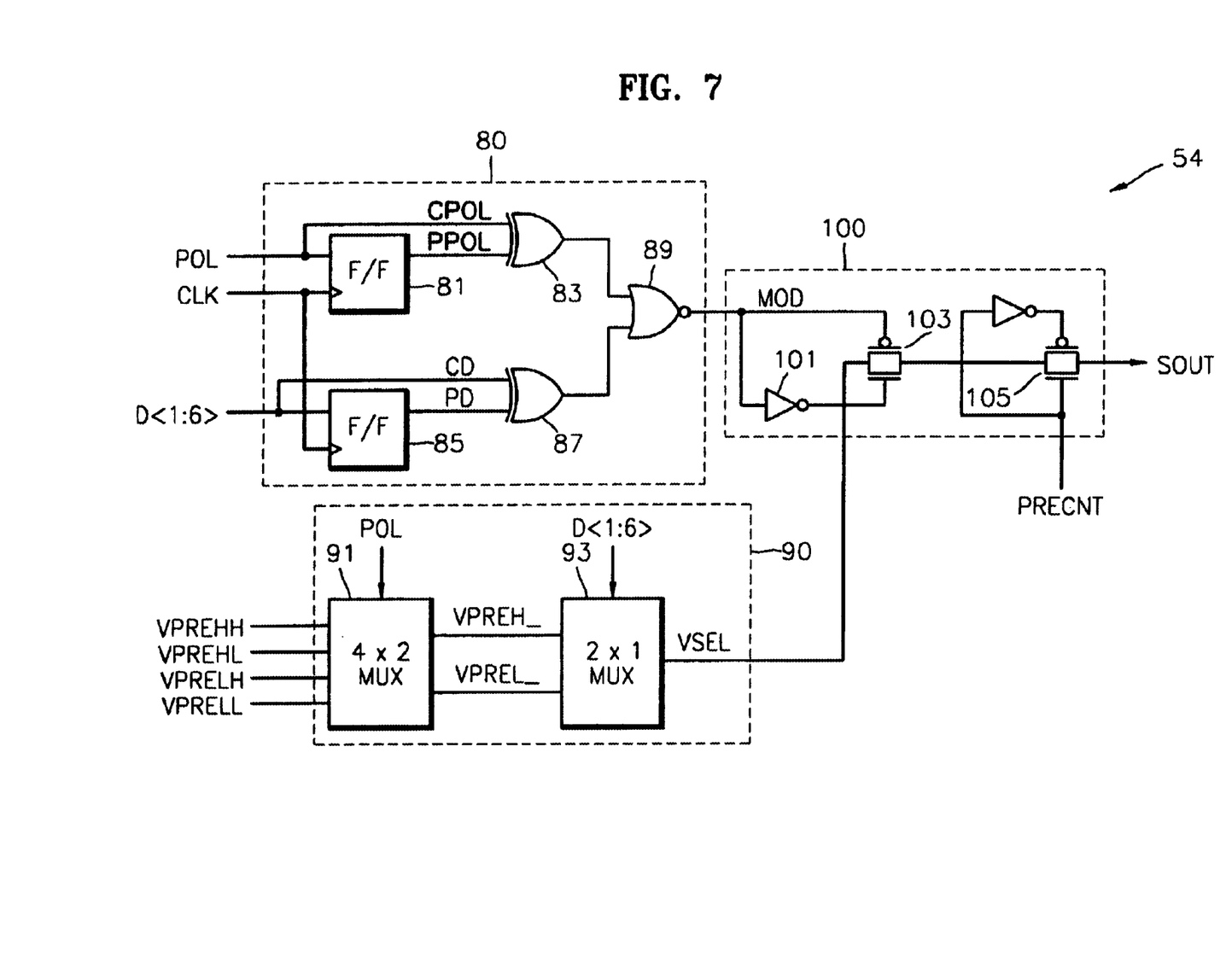
FIG. 7 is a circuit diagram of a precharge voltage generating circuit according to a preferred embodiment of the present invention.

FIG. 7 is a circuit diagram of a precharge voltage generating circuit according to a preferred embodiment of the present invention. Referring to FIGS. 4 and 7, the structure of the precharge voltage generating circuit 54 will now be described.

The mode selection circuit 80 comprises two flip-flops 81 and 85, a first logic gate 83, a second logic gate 87, and a third logic gate 89. The flip-flop 81 latches the polarity inversion signal POL in response to the rising edge of the clock signal CLK, and the flip-flop 85 latches MSB (D<1:6>) in response to the rising edge of the clock signal CLK.

The first logic gate 83 is formed with an XOR gate for comparing the output signal PPOL of the flip-flop 81 and the polarity inversion signal POL being currently input.

Here, the output signal PPOL of the flip-flop 81 indicates the polarity inversion signal POL of data (for example, the second data) that is input immediately before the current data (for example, the first data).

The second logic gate 87 is formed with an XOR gate for comparing the output signal PD of the flip-flop 85 and the MSB (D<1:6>) of data being currently input. Here, the output signal PD of the flip-flop 85 indicates the MSB of the data (hereinafter, referred to as "immediately-before data") that is input immediately before the current data (hereinafter, referred to as "current data") is input. For example, the immediately-before data may be referred to as first data, and the current data, as second data.

The third logic gate 89 is formed with a NOR gate, performs a NOR operation with the output signal of the first logic gate 83 and the output signal of the second logic gate 87, and outputs the result, that is, a mode selection signal MOD. If the output signal of the first logic gate 83 is a "high" logic level, the phase of the polarity inversion signal CPOL of the immediately-before data is different from the phase of the polarity inversion signal PPOL of the current data. If the output signal of the second logic gate 87 is a "high" logic level, the MSB PD of the immediately-before data is different from the MSB CD of the current data.

Therefore, the signal line 69 should be precharged to a predetermined level.

The precharge voltage selection circuit 90 comprises a first selection circuit 91 and a second selection circuit 93. In response to a first selection signal (for example, the polarity inversion signal (POL) of the current data), the first selection circuit 91 outputs the first precharge voltage VPRELL and the second precharge voltage VPRELH, or the third precharge voltage VPREHL and the fourth precharge voltage VPREHH, among the first precharge voltage VPRELL, the second precharge voltage VPRELH, the third precharge voltage VPREHL, and the fourth precharge voltage VPREHH. The first selection circuit 91 may be implemented by a multiplexer MUX having 4 inputs and 2 outputs.

VPREH_ of FIG. 7 indicates the third precharge voltage VPREHL and the fourth precharge voltage VPREHH, and VPREL_ indicates the first precharge voltage VPRELL and the second precharge voltage VPRELH. Also, the first precharge voltage VPRELL may be referred to as a first pre-discharge voltage, and the second precharge voltage VPRELH may be referred to as a second pre-discharge voltage.

In response to the MSB (D<1:6>) of the current data, the second selection circuit 93 outputs one voltage VSEL selected between the first precharge voltage VPRELL and the second precharge voltage VPRELH, or between the third precharge voltage VPREHL and the fourth precharge voltage VPREHH. The second selection circuit 93 may be implemented by a MUX having two inputs and one output.

The output circuit 100 comprises two inverters 101 and 107, a first transmission gate 103, and a second transmission gate 105. In response to the mode selection signal MOD, the first transmission gate 103 transmits the output signal VSEL of the precharge voltage selection circuit 90 to the second transmission gate 105. In response to the precharge timing control signal PRECNT, the second transmission gate 105 outputs the output signal of the first transmission gate 103.

Figure 8:
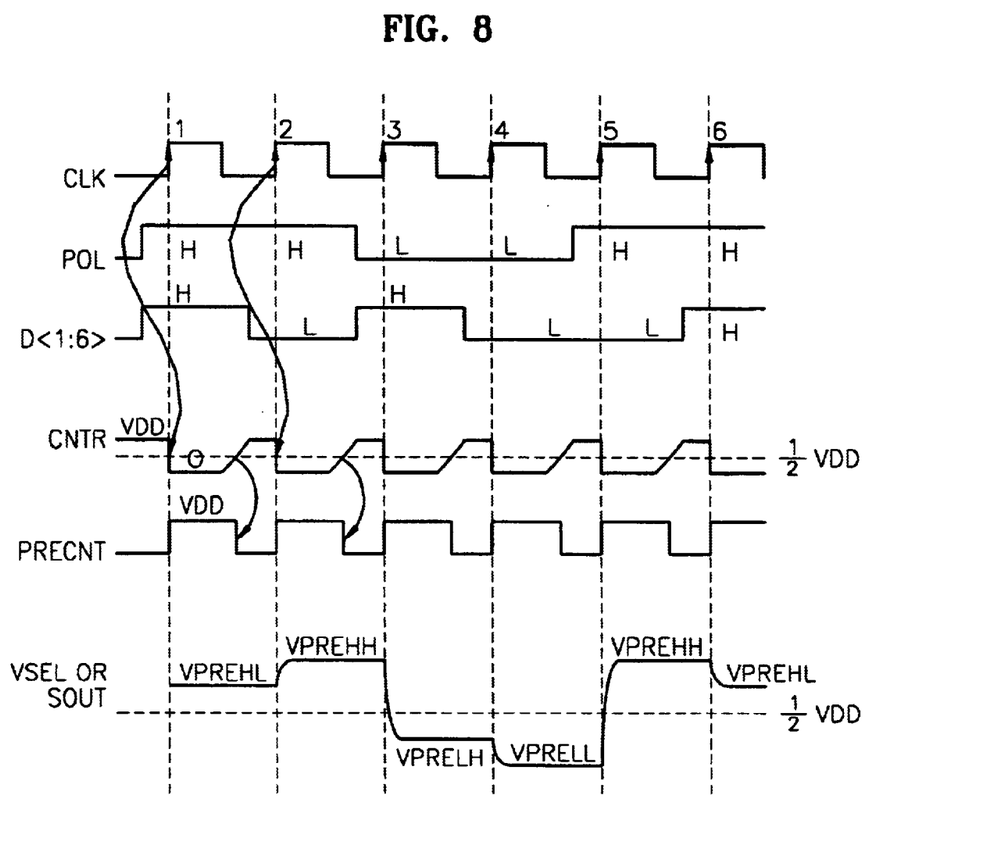
FIG. 8 is a timing diagram of an input/output signal of FIG. 7.
Figure 9:
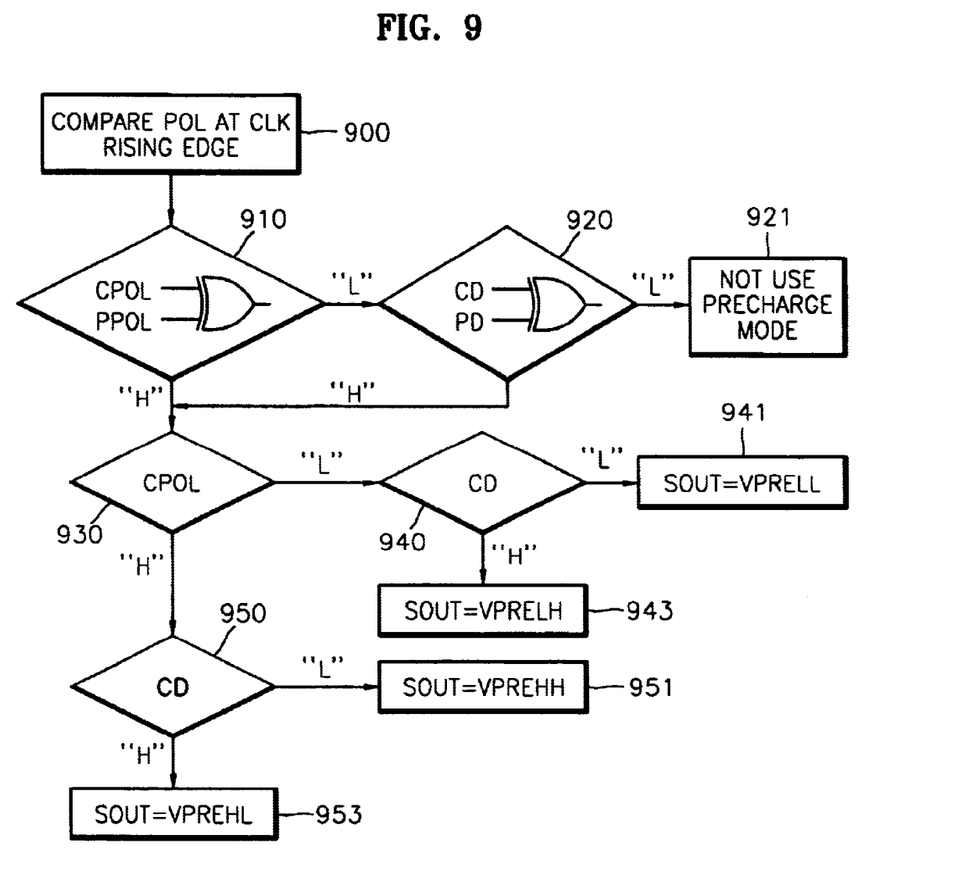
FIG. 9 is a flowchart of a precharge voltage generating method according to a preferred embodiment of the present invention.

FIG. 8 is a timing diagram of an input/output signal of FIG. 7. FIG. 9 is a flowchart of a precharge voltage generating method according to a preferred embodiment of the present invention. Referring to FIGS. 7 through 9, CPOL indicates the polarity inversion signal of the current data, and PPOL indicates the polarity inversion signal of the immediately-before data latched in the flip-flop 81. Also, CD indicates the MSB of the current data and PD indicates the MSB of the immediately-before data latched in the flip-flop 85.

In the precharge voltage generating circuit and method according to the present invention, in every rising edge of the clock signal CLK in the precharge mode, CPOL and PPOL are compared in step 910, CD and PD are compared in step 920, and one precharge voltage is selected among the precharge voltages having different voltage levels, and outputs to the source driver signal line 69 of FIG. 3. However, if the result of performing an XOR operation for CPOL and PPOL in step 910 is a "low" logic level "L", and the result of performing an XOR operation for CD and PD in step 920 is a "low" logic level "L", the precharge voltage generating circuit 54 does not operate in the precharge mode. That is, the precharge voltage generating circuit 54 does not operate or is inactivated in step 921.

First, if it is assumed that in a first rising edge 1 of the clock signal CLK, PPOL and PD are a "low" logic level and CPOL and CD are a "high" logic level, the output signal of the first logic circuit 83 is a "high" logic level, and the output signal of the second logic circuit 87 is a "high" logic level.

Therefore, since the mode selection circuit 80 and the determination result of step 910 are a "high" logic level, the precharge voltage selection circuit 90 determines the state of CPOL in step 930. Since the result of determination in step 930 is that CPOL is a "high" logic level "H", the precharge voltage selection circuit 90 determines the state of DC in step 950. Since the result of determination in step 950 is a "high" logic level "H", the precharge voltage selection circuit 90 outputs the third precharge voltage VPREHL.

In response to the output signal of the first logic circuit 83 that is a "high" logic level, and the output signal of the second logic circuit 87 that is a "high" logic level, the third logic gate 89 outputs the mode selection signal MOD having a "low" logic state. The mode selection signal MOD that is a "low" logic level indicates the precharge mode.

Since in the precharge mode, the first transmission gate 103 is turned on in response to the output signal MOD of the third logic gate 89, the first transmission gate 103 outputs the output signal VPREHL of the precharge voltage selection circuit 90 to the second transmission gate 105.

Also, in response to the precharge timing control signal PRECNT that is activated (for example, a "high" logic level), the second transmission gate 105 outputs the output signal VPREHL of the precharge voltage selection circuit 90. Thus, the output circuit 100 outputs the output signal VPREHL of the precharge voltage selection circuit 90 to the signal line 69 of FIG. 3 for an activated interval of the precharge timing control signal PRECNT in step 953 such that the signal line 69 is precharged with the third precharge voltage VPREHL.

If the precharge timing control signal PRECNT is inactivated and the second transmission gate 105 is inactivated, the signal line 69 is floating, and accordingly maintains the third precharge voltage VPREHL.

Next, the precharge voltage generating circuit and method in the second rising edge 2 will now be described. In this case, PPOL, CPOL, and PD are a "high" logic level and CD is a "low" logic level. Since the output signal of the first logic circuit 83 is a "low" logic level and the output signal of the second logic circuit 87 is a "high" logic level, the output signal MOD of the third logic gate 89 is a "low" logic level. Accordingly, the precharge voltage generating circuit 54 can operated in the precharge mode.

Also, since the result of determination in step 910 is a "low" logic level "L", CD and PD are compared in step 920. Since the result of step 920 is a "high" logic level "H", it is determined the state of CPOL in step 930. Since CPOL is a "high" logic level and CD is a "low" logic level, the precharge voltage generating circuit 90 outputs the first precharge voltage VPREHH in step 951. Therefore, the signal line 69 is precharged with the first precharge voltage VPREHH.

Accordingly, in response to the output signal MOD of the third logic gate 89 that is a "low" logic level, the first transmission gate 103 outputs the output signal VPREHH of the precharge voltage selection circuit 90 to the second transmission gate 105.

Also, in response to the precharge timing control signal PRECNT that is a "high" logic level, the second transmission gate 105 outputs the output signal VPREHH of the precharge voltage selection circuit 90 to the signal line 69.

Thus, the output circuit 100 outputs the output signal VPREHH of the precharge voltage selection circuit 90 to the signal line 69 of FIG. 3 for an activated interval of the precharge timing control signal PRECNT in step 953. If the precharge timing control signal PRECNT is inactivated and the transmission gate 105 is inactivated, the signal line 69 is floating, and accordingly maintains the first precharge voltage VPREHH.

The precharge voltage generating circuit and method in the third rising edge 3 will now be described. In this case, PPOL is a "high" logic level, CPOL and CD are a "low" logic level, and PD is a "high" logic level.

Referring to FIG. 9, since the result of determination in step 910 is a "high" logic level "H", the result of determination in step 930 is a "low" logic level "L", and the result of determination in step 940 is a "high" logic level "H", the output circuit 100 outputs the second precharge voltage VPRELH to the signal line 69. Therefore, the signal line 69 is precharged or pre-discharged by the second precharge voltage VPRELH.

That is, in response to the polarity inversion signal POL of the current data and the MSB (D<1:6>) of the current data, the precharge voltage selection circuit 90 of FIG. 7 outputs the second precharge voltage VPRELH to the first transmission gate 103.

Since the precharge voltage generating method related to the fourth rising edge 4 through the sixth rising edge 6 of the clock signal CLK can be understood from the precharge voltage generating method related to the first rising edge 1 through the third rising edge 3 of the clock signal CLK that are described referring to FIGS. 7 and 8, descriptions will be omitted.

Therefore, the precharge method and precharge voltage generating circuit according to the present invention can maintain a constant slew rate regardless of the level of the next output.

Figure 10:
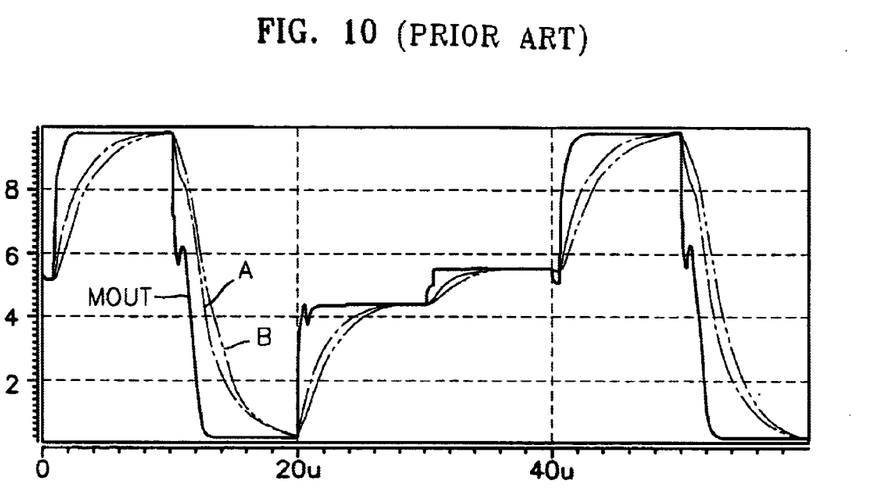
FIG. 10 shows an output voltage of a source driver of the prior art signal bank array.

FIG. 10 shows waveforms of source driver signal lines of the prior art signal bank array. Referring to FIGS. 2 and 10, the output waveforms of FIG. 10 show the waveform of an output terminal of the source driver 11, and output waveforms of nodes A and B when the switch S/W is open. The slew rate of the signal of node B increases more than the slew rate of the signal of node A.

Figure 11:
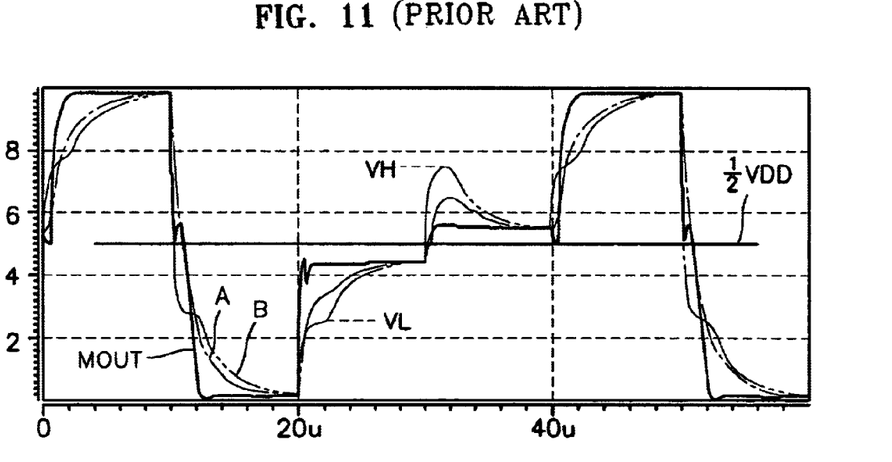
FIG. 11 shows an output voltage of a source driver of the prior art dual bank array.

FIG. 11 shows waveforms of source driver signal lines of the prior art dual bank array. Referring to FIGS. 2 and 11, the output waveforms of FIG. 11 indicate a case where precharge voltages are set to the first voltage VL and the second voltage VH. The waveform of node B of FIG. 11 is worse than that of node B of FIG. 10.

Figure 12:
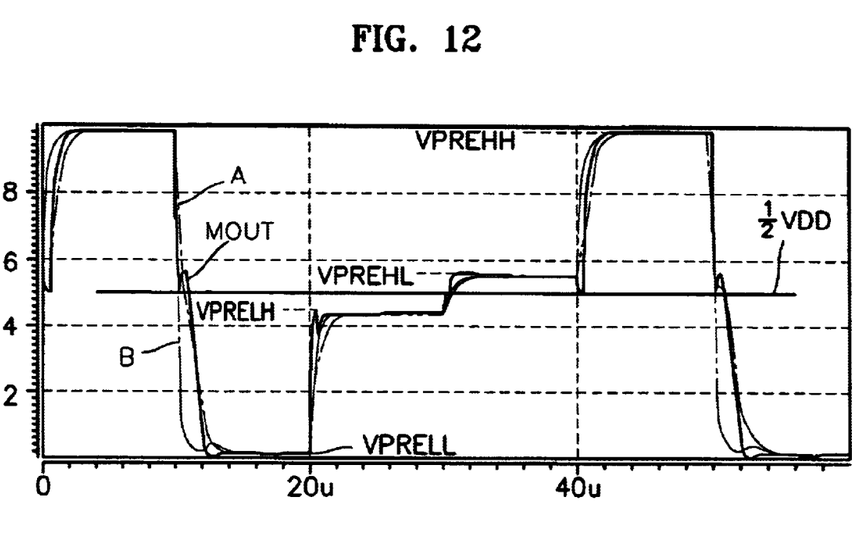
FIG. 12 is a timing diagram of an output signal of a precharge voltage generating circuit according to a preferred embodiment of the present invention.

FIG. 12 shows waveforms of source driver signal lines having a precharge voltage generating circuit according to the preferred embodiment of the present invention. Referring to FIGS. 2 and 12, when the switch S/W is short, that is, the auxiliary source driver operates, the precharge voltage generating circuit 54 outputs an optimum precharge voltage, and accordingly the slew rate of all output waveforms is constant.

Since a signal line precharge method and module can be easily understood from the precharge voltage generating circuit according to the present invention referring to FIGS. 3 through 9, descriptions of the signal line precharge method and module will be omitted.

As described above, in the precharge method and precharge voltage generating circuit according to the present invention, in response to change of the polarity inversion signal and change of the MSB of data being input, a signal line connected to the auxiliary source driver is precharged to an optimal precharge level such that a short and constant slew rate of all output signal is maintained.

Also, the precharge method and precharge voltage generating circuit according to the present invention reduces the size of a chip. In addition, the number of elements mounted on a PCB and the number of output voltages decrease such that test time is shortened and an initial yield increases. The PCB size is also reduced and the cost of source driver ICs is reduced. Since in the precharge method and precharge voltage generating circuit according to the present invention the signal line operates during a precharging time, current consumption is reduced.

Optimum embodiments have been explained above and are shown. However, the present invention is not restricted to the above-described embodiments and many variations are possible within the spirit and scope of the present invention. The scope of the present invention is not determined by the above description but by the accompanying claims.

What is claimed is:

1. A signal line precharge method for precharging a signal line connected to an auxiliary source driver to a predetermined voltage level in a precharge mode, the method comprising:

in response to the combination of a polarity inversion signal of input data and the most significant bit of the input data, outputting one voltage level selected among precharge voltages having different voltage levels; and in response to a precharge timing control signal, precharging the signal line to the selected voltage level.

2. The method of claim 1, further comprising controlling the activation time of the precharge timing control signal.

3. The method of claim 1, wherein the signal line is connected to the source of a thin film transistor (TFT).

4. A signal line precharge method comprising:

storing a first polarity inversion signal of first data;

comparing the first polarity inversion signal with a second polarity inversion signal of second data being input following the first data;

if the comparison result indicates that the phase of the first polarity inversion signal is different from the phase of the second polarity inversion signal, in response to the combination of the second polarity inversion signal and the most significant bit of the second data, outputting one voltage level selected from precharge voltages having different voltage levels; and in response to a precharge timing control signal, precharging a signal line connected to an auxiliary source driver to the selected voltage level.

5. The method of claim 4, further comprising controlling the activation time of the precharge timing control signal.

6. The method of claim 4, wherein the signal line is connected to the source of a thin film transistor (TFT).

7. A signal line precharge method comprising:

storing a first polarity inversion signal of first data and the most significant bit of the first data;

comparing the first polarity inversion signal with a second polarity inversion signal of second data being input following the first data, and comparing the most significant bit of the first data with the most significant bit of the second data;

if the comparison result indicates that the polarity of the first polarity inversion signal is the same as the phase of the second polarity inversion signal and the most significant bit of the first data is different from the most significant bit of the second data, in response to the combination of the second polarity inversion signal and the most significant bit of the second data, outputting one voltage level selected among precharge voltages having different voltage levels; and in response to a precharge timing control signal, precharging a signal line connected to an auxiliary source driver to the selected voltage level.

8. The method of claim 7, further comprising controlling the activation time of the precharge timing control signal.

9. A signal line precharge method for precharging each signal line connected to an auxiliary source driver IC corresponding to the signal line among a plurality of auxiliary source driver ICs, to a predetermined voltage level in a precharge mode, the method comprising:
in response to the combination of a polarity inversion signal of input data and the most significant bit of the input data, outputting one voltage level selected from precharge voltages having different voltage levels; and
in response to a precharge timing control signal, precharging the signal line to the selected voltage level.

10. The method of claim 9, further comprising controlling the activation time of the precharge timing control signal in response to a variable resistor mounted on the module.

11. A signal line precharge method for precharging each signal line, which is connected to an auxiliary source driver IC corresponding to the signal line among a plurality of auxiliary source driver ICs and sends a signal, to a predetermined voltage level in a precharge mode, the method comprising:
storing a first polarity inversion signal of first data;
comparing the first polarity inversion signal with a second polarity inversion signal of second data being input following the first data;
if the comparison result indicates that the level of the first polarity inversion signal is different from the level of the second polarity inversion signal, in response to the combination of the second polarity inversion signal and the most significant bit of the second data, outputting one voltage level selected among precharge voltages having different voltage levels; and
in response to a precharge timing control signal, precharging the signal line connected to said auxiliary source driver to the selected voltage level.

12. The method of claim 11, further comprising controlling the activation time of the precharge timing control signal in response to a variable resistor mounted on the module.

13. A signal line precharge method for precharging each signal line, which is connected to an auxiliary source driver IC corresponding to the signal line among a plurality of auxiliary source driver ICs and sends a signal, to a predetermined voltage level in a precharge mode, the method comprising:
storing a first polarity inversion signal of first data and the most significant bit of the first data;
comparing the first polarity inversion signal with a second polarity inversion signal of second data being input following the first data, and comparing the most significant bit of the first data with the most significant bit of the second data;
if the comparison result indicates that the level of the first polarity inversion signal is the same as the level of the second polarity inversion signal and the most significant bit of the first data is different from the most significant bit of the second data, in response to the combination of the second polarity inversion signal and the most significant bit of the second data, outputting one voltage level selected among precharge voltages having different voltage levels; and
in response to a precharge timing control signal, precharging the signal line connected to said auxiliary source driver to the selected voltage level.

14. A precharge voltage generating circuit for precharging a signal line connected to an auxiliary source driver to a predetermined voltage level in a precharge mode, the circuit comprising:
a precharge voltage selection circuit which in response to the combination of a polarity inversion signal of input data and the most significant bit of the input data, outputs one voltage level selected among precharge voltages having different voltage levels; and
an output circuit which in response to a precharge timing control signal, outputs the selected voltage level to the signal line.

15. The precharge voltage generating circuit of claim 14, wherein the precharge timing control signal is activated in response to a clock signal and inactivated in response to an input signal which is input from the outside of the precharge voltage generating circuit, and the activation time of the precharge timing control signal is controlled in response to the input signal.

16. The precharge voltage generating circuit of claim 14, wherein the output circuit comprises a transmission gate which outputs the selected voltage level to the signal line in response to the precharge timing control signal.

17. A precharge voltage generating circuit for precharging a signal line connected to an auxiliary source driver to a predetermined voltage level in a precharge mode, the circuit comprising:
the pad;
a precharge timing control circuit which in response to the combination of a clock signal and an input signal which is input through the pad, outputs a precharge timing control signal;
a precharge voltage selection circuit which in response to the combination of a polarity inversion signal of input data and the most significant bit of the input data, outputs one voltage level selected among precharge voltages having different voltage levels; and
an output circuit which in response to a precharge timing control signal, outputs the selected voltage level to the signal line.

18. The precharge voltage generating circuit of claim 17, wherein the activation time of the precharge timing control signal is controlled corresponding to the resistance of a variable external resistor which is connected between a power source voltage and the pad.

19. A module on which a plurality of auxiliary source driver ICs that are serially connected are mounted,
wherein each of the auxiliary source driver ICs comprises a precharge voltage generating circuit which is connected to a signal line corresponding to the auxiliary source driver IC and precharges the signal line to a predetermined voltage level, and the precharge voltage generating circuit comprises:
a precharge voltage selection circuit which in response to the combination of a polarity inversion signal of input data and the most significant bit of the input data, outputs one voltage level selected among precharge voltages having different voltage levels in a precharge mode; and
an output circuit which in response to a precharge timing control signal, outputs the selected voltage level to the signal line.

20. The module of claim 19, wherein the activation time of the precharge timing control signal is controlled by a variable external resistor serially connected to the plurality of source driver ICs that are serially connected.

21. A module on which a plurality of source driver ICs that are serially connected are mounted, comprising:

a TFT-LCD panel;

the plurality of source driver ICs that are arranged in the row direction on the upper part of the TFT-LCD panel; and a plurality of auxiliary source driver ICs that are arranged in the row direction on the lower part of the TFT-LCD panel, wherein each of the auxiliary source driver ICs comprises a precharge voltage generating circuit which is connected to a signal line corresponding to the auxiliary source driver IC and precharges the signal line to a predetermined voltage level, and the precharge voltage generating circuit comprises:

a precharge timing control circuit which outputs a precharge timing control signal the activation time of which is controlled in response to the combination of a clock signal and an input signal;

a precharge voltage selection circuit which in response to the combination of a polarity inversion signal of input data and the most significant bit of the input data, outputs one voltage level selected among precharge voltages having different voltage levels; and an output circuit which in response to the precharge timing control signal, outputs the selected voltage level to the signal line.

* * * * *

UNITED STATES PATENT AND TRADEMARK OFFICE
CERTIFICATE OF CORRECTION

PATENT NO. : 6,756,957 B2  Page 1 of 1
DATED : June 29, 2004
INVENTOR(S) : Sang-ho Park

It is certified that error appears in the above-identified patent and that said Letters Patent is hereby corrected as shown below:

Column 11,
Lines 38 and 68, delete "the" and insert -- a --.
Line 68, delete "said" and insert -- an --.

Column 12,
Line 28, delete "the" and insert -- a --.

Signed and Sealed this

Seventh Day of February, 2006

JON W. DUDAS
*Director of the United States Patent and Trademark Office*

UNITED STATES PATENT AND TRADEMARK OFFICE
CERTIFICATE OF CORRECTION

PATENT NO. : 6,756,957 B2  Page 1 of 1
APPLICATION NO. : 10/357605
DATED : June 29, 2004
INVENTOR(S) : Sang-ho Park It is certified that error appears in the above-identified patent and that said Letters Patent is hereby corrected as shown below:

On the title page, item [54] & Column 1 line 1:
In the title, after "SIGNAL LINE" please insert --IN A THIN-FILM-TRANSISTOR (TFT) LIQUID CRYSTAL DISPLAY (LCD) APPARATUS--.

In Column 4, in the eleventh (11th) line from the bottom of the column, after "through 57" please insert --can be an integrated circuit (IC) and--.

In Column 11, claim 11, line 3 of the claim, please delete "IC".

In Column 11, claim 11, line 4 of the claim, please delete "driver ICs" and insert --drivers--.

In Column 11, claim 13, line 3 of the claim, please delete "IC".

In Column 11, claim 13, line 4 of the claim, please delete "driver ICs" and insert --drivers--.

In Column 12, claim 17, line 5 of the claim, please delete "the" and replace it with --a--.

In Column 12, claim 17, line 15 of the claim, please delete "a" and replace it with --the--.

Signed and Sealed this

Eighteenth Day of December, 2007

JON W. DUDAS
*Director of the United States Patent and Trademark Office*